(12) United States Patent
Kumar et al.

(10) Patent No.: US 10,430,528 B2
(45) Date of Patent: Oct. 1, 2019

(54) METHOD AND SYSTEM FOR MANAGING SPACE CONFIGURATIONS

(71) Applicant: SIGNIFY HOLDING B.V., Eindhoven (NL)

(72) Inventors: Rohit Kumar, Hackensack, NJ (US); Maulin Dahyabhai Patel, Tuckahoe, NY (US); Mathan Kumar Gopal Samy, Medford, MA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 80 days.

(21) Appl. No.: 15/569,691

(22) PCT Filed: May 9, 2016

(86) PCT No.: PCT/EP2016/060277
§ 371 (c)(1),
(2) Date: Oct. 26, 2017

(87) PCT Pub. No.: WO2016/180754
PCT Pub. Date: Nov. 17, 2016

(65) Prior Publication Data
US 2018/0121572 A1    May 3, 2018

Related U.S. Application Data

(60) Provisional application No. 62/160,342, filed on May 12, 2015.

(51) Int. Cl.
*G06F 17/50* (2006.01)
*H05B 37/02* (2006.01)

(52) U.S. Cl.
CPC ..... *G06F 17/5004* (2013.01); *H05B 37/0227* (2013.01); *H01H 2300/03* (2013.01)

(58) Field of Classification Search
CPC ...... G06F 17/5004; G06F 17/50; G06F 3/011; H05B 37/0227; H05B 37/02; H05B 37/0245; H05B 37/03; H05B 37/034; H04N 5/232; H04N 9/74; H04N 5/33; H04N 5/30; G01R 31/44; G01R 31/24; G01R 31/2635; G06K 9/0035; G06K 9/00345; G06K 9/003489; G06K 9/00355; G06K 9/00362; G06K 9/00378; G06K 9/00382;

(Continued)

(56) References Cited

U.S. PATENT DOCUMENTS 5,425,179 A * 6/1995 Nickel ............... G01C 9/20
33/366.16
6,909,921 B1   6/2005 Bilger

FOREIGN PATENT DOCUMENTS

EP    2372238 B1    1/2014
WO   2010063001 A1   6/2010

(Continued)

*Primary Examiner* — Duy M Dang

(57) ABSTRACT

A system for managing workspace configurations disclosed. The system comprises a plurality of sensors, at least one of the sensors being associated with a corresponding workspace, determining changes in a current configuration of the work space with regard to a previous configuration of the space, wherein the current configuration is determined based on signals received from selected ones of the sensors and providing an indication when the a change in the configuration has been determined.

13 Claims, 7 Drawing Sheets

(58) Field of Classification Search
CPC .. G06K 9/00389; G06K 9/00671; G06K 9/18; G06K 9/2018; G06K 9/2063; A61B 5/103; A61B 5/1113–1118; A61B 5/0059; A61B 5/489; A61B 5/742; A61B 6/462; A61B 6/5247; A61B 8/00; A61B 8/4245; A61B 8/462; A61B 8/5238; A61B 8/466; A61B 8/4263; A61B 90/36; A61B 34/72; A61B 34/20; A61B 2034/2055; A61B 2090/366; A61B 2034/107; A61B 2090/372; A61B 2034/2059; A61B 2090/378; A61B 2090/365; G09G 5/00; G06T 5/50; G06T 19/006; G06T 7/73; G06T 2207/10048; G06T 2207/10016; G06T 7/74; G02B 27/01; G02B 27/017; G02B 21/0012; G02B 21/36; G02B 2027/0134; G02B 2027/0138; G02B 2027/014; G02B 2027/0187; G02B 1/00; G02B 5/20; G02B 5/26; G02B 5/208; G02B 5/22; G01N 21/88; G01N 21/90; G01N 21/9081; G01N 21/9027; G01N 21/958; C08J 3/226

See application file for complete search history.

(56) References Cited

FOREIGN PATENT DOCUMENTS

| | | |
|---|---|---|
| WO | 2011151772 A1 | 12/2011 |
| WO | 2012176101 A2 | 12/2012 |
| WO | 2013011395 A2 | 1/2013 |
| WO | 2013054221 A1 | 4/2013 |

* cited by examiner

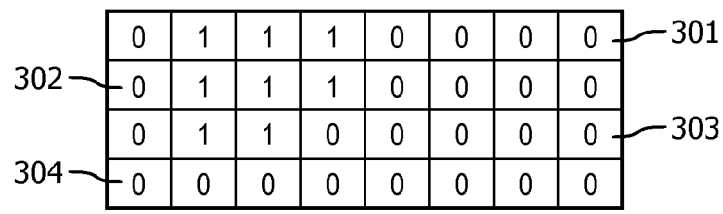
FIG. 4B
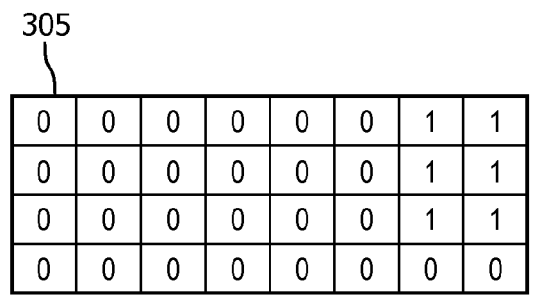
FIG. 4C
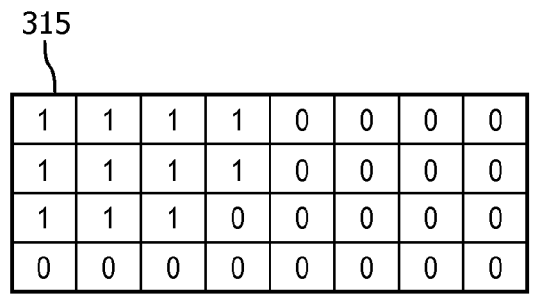
FIG. 4D
FIG. 4E

METHOD AND SYSTEM FOR MANAGING SPACE CONFIGURATIONS

CROSS-REFERENCE TO PRIOR APPLICATIONS

This application is the U.S. National Phase application under 35 U.S.C. § 371 of International Application No. PCT/EP2016/060277, filed on May 9, 2016 which claims the benefit of U.S. Provisional Patent Application No. 61/160,342, filed on May 12, 2015. These applications are hereby incorporated by reference herein.

The present invention relates to the field of office lighting management and response and more particularly to the dynamic workstation configuration.

A building or a workplace is a complex environment which consists of many dynamic and static components. For instance, office-space and workspace layout is a field in which the building management organizes lighting, heat and cooling based on a typical floor plan.

In addition, electronic sensing and switching has automated the workplace as sensors are increasing being used to determine the presence of personnel within the workplace and adjust temperature and lighting accordingly.

However, office space and workspace layout may dynamically change as personnel are assigned and/or reassigned to different areas. In addition, personnel may choose to rearrange their workspace in order to work closer together. Such reorganization of workstation layout causes misalignment between sensor's field of view (FOV) and workstation configuration. The re-organization of the workplace without corresponding changes to the automated lighting and air-conditioning systems reduces the efficiency of the automated system. This results not only in reduced energy savings but also causes discomfort to other persons as the number of false positive and/or false negative detections may increase.

Currently, the process to realign the sensing systems (or sensors) to the changed office space configuration is done manually which is a very tedious, time-consuming and error-prone.

Thus, there is a need in the industry for a method and system for automating the process of realigning the sensing system as changes are made to the office space.

In accordance with the principles of the invention, a system for managing workspace configurations is disclosed. The system comprises of a plurality of sensors, at least one of the sensors being associated with a corresponding space, determining changes in a current configuration of the space with regard to a previous configuration of the space, wherein the current configuration is determined based on signals received from selected ones of the sensors.

In accordance with the principles of the invention, spaces are subdivided into a plurality of subspaces, wherein at least one of the plurality of sensors is associated with selected ones of the subspaces.

In another aspect of the invention, current and previous configurations of a space are compared to determine whether a change in the configuration of a space has occurred.

In another aspect of the invention, current and previous configurations of a space are compared by comparing a current configuration element mapping with a previous configuration element mapping by comparing associated grid elements of the current configuration and the previous configuration.

In another aspect of the invention a current and a previous configuration of a space are compared by comparing a characteristic of the current configuration and the characteristic of the previous configuration.

In another aspect of the invention, a reorganization plan may be generated when a change of a configuration is determined.

For a better understanding of exemplary embodiments and to show how the same may be carried into effect, reference is made to the accompanying drawings. It is stressed that the particulars shown are by way of example only and for purposes of illustrative discussion of the preferred embodiments of the present disclosure, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIGS. 4A-4E illustrate an exemplary sensor mapping in accordance with the principles of the invention.

It is to be understood that the figures and descriptions of the present invention described herein have been simplified to illustrate the elements that are relevant for a clear understanding of the present invention, while eliminating, for purposes of clarity many other elements. However, because these omitted elements are well-known in the art, and because they do not facilitate a better understanding of the present invention, a discussion of such elements is not provided herein. The disclosure herein is directed to also variations and modifications known to those skilled in the art.

Figure 1:
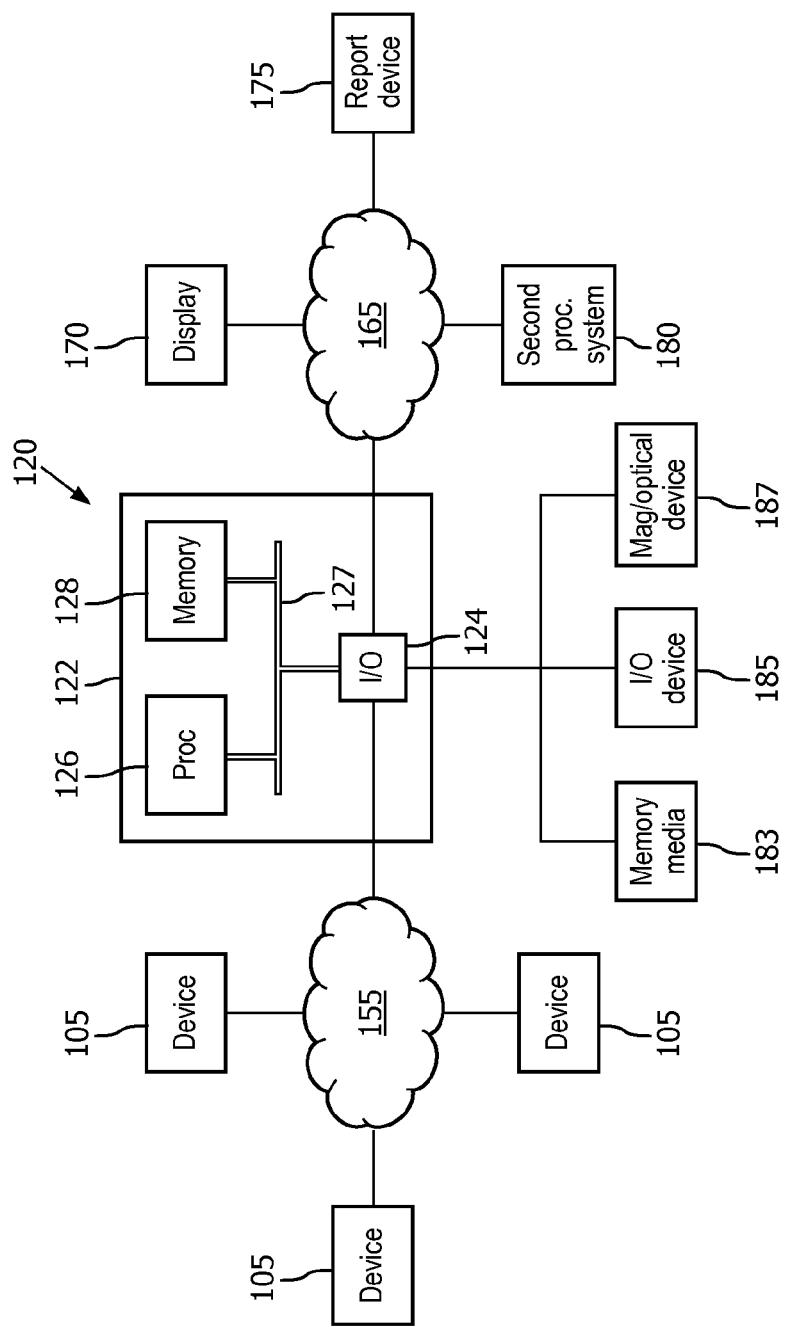
FIG. 1 illustrates an exemplary system configuration in accordance with the principles of the invention.

FIG. 1 illustrates an exemplary system configuration 100 in accordance with the principles of the invention.

FIG. 1 illustrates an exemplary configuration of a configuration engine 120 for implementing the principles of the invention shown herein. In this exemplary configuration engine embodiment 120, input data is received from sources 105 (e.g. user interface 110, sensors, etc.) over network 155 and is processed in accordance with one or more programs, either software or firmware, executed by processing system 122. The results of processing system 122 may then be transmitted over network 165 for viewing on one or more of display 170, reporting device 175 and/or a second processing system 180.

Processing system 122 includes one or more input/output devices 124 that receive data from the illustrated sources or devices 105 over network 155. The received data is then applied to processor 126, which is in communication with input/output device 124 and memory 128. Input/output devices 105, processor 126 and memory 128 may communicate over a communication medium 127. Communication medium 127 may represent a communication network, e.g., ISA, PCI, PCMCIA bus, one or more internal connections of a circuit, circuit card or other device, as well as portions and combinations of these and other communication media.

Processing system 122 and/or processor 124 may be representative of a handheld calculator, special purpose or general purpose processing system, desktop computer, laptop computer, palm computer, cell phone, smart phone or personal digital assistant (PDA) device, etc., as well as portions or combinations of these and other devices that can perform the operations illustrated.

Processor 124 may be a central processing unit (CPU) or dedicated hardware/software, such as a PAL, ASIC, FGPA, operable to execute computer instruction code or a combination of code and logical operations. In one embodiment, processor 124 may include code which, when executed by the processor, performs the operations illustrated herein. The code may be contained in memory 128, may be read or downloaded from a memory medium such as a CD-ROM or floppy disk, represented as 183, may be provided by a manual input device 185, such as a keyboard or a keypad entry, or may be read from a magnetic or optical medium (not shown) or via a second I/O device 187 when needed. Information items provided by devices 183, 185, 187 may be accessible to processor 122 through input/output device 124, as shown. Further, the data received by input/output device 124 may be immediately accessible by processor 126 or may be stored in memory 128. Processor 122 may further provide the results of the processing to display 180, recording device 190 or a second processing unit 195.

As one skilled in the art would recognize, the terms processor, processing system, computer or computer system may represent one or more processing units in communication with one or more memory units and other devices, e.g., peripherals, connected electronically to, and communicating with, the at least one processing unit. Furthermore, the devices illustrated may be electronically connected to the one or more processing units via internal busses, e.g., serial, parallel, ISA bus, Micro Channel bus, PCI bus, PCMCIA bus, USB, etc., or one or more internal connections of a circuit, circuit card or other device, as well as portions and combinations of these and other communication media, or an external network, e.g., the Internet and Intranet. In other embodiments, hardware circuitry may be used in place of, or in combination with, software instructions to implement the invention. For example, the elements illustrated herein may also be implemented as discrete hardware elements or may be integrated into a single unit.

As would be understood, the operations illustrated may be performed sequentially or in parallel using different processors to determine specific values. Processing system 122 may also be in two-way communication with each of the sources 105. Processing system 122 may further receive or transmit data over one or more network connections from a server or servers over, for example, a global computer communications network such as the Internet, Intranet, a wide area network (WAN), a metropolitan area network (MAN), a local area network (LAN), a terrestrial broadcast system, a cable network, a satellite network, a wireless network, or a telephone network (POTS), as well as portions or combinations of these and other types of networks. As will be appreciated, networks 155 and 165 may also be internal networks or one or more internal connections of a circuit, circuit card or other device, as well as portions and combinations of these and other communication media or an external network, e.g., the Internet and Intranet (wired and wirelessly).

The layout of office buildings is often changed either due to reorganization or due to individual preferences.

Figure 2:
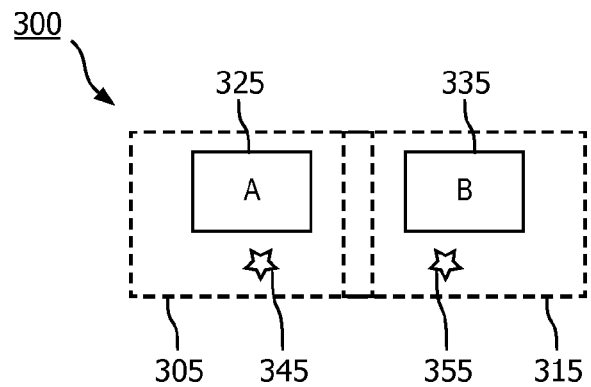
FIG. 2 illustrates an exemplary configuration.

FIG. 2 illustrates an exemplary workspace configuration wherein there are two workspaces 305, 315 suitable for use by users A, 325 and B 335, respectively. Each of the workspaces is controlled by corresponding occupancy sensor 345, 355. The sensors are deployed such that their field of view is largely limited to the workspace (e.g., one desk) and does not extend to the user at neighboring desk. In this case, occupancy sensors 345, 355 will only activate lighting, for example, when users A 325 and B 335 are present. When user B 335 is not present in the office, the corresponding light can be switched off or dimmed down without affecting the lighting for user A 325.

Figure 3:
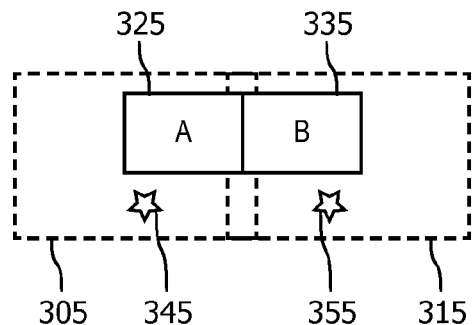
FIG. 3 illustrates an exemplary altered configuration.

FIG. 3 illustrates an exemplary workspace configuration in which the user A, 325 is repositioned to be closer to user B, 335.

In this case, if only user A, 325 is working, and user B is absent, the occupancy sensor 345, 355 will continue to trigger the lighting in both areas 305, 315.

In addition, using the senor information, an incorrect count of the number of people in the area may be determined. An incorrect number of people occupying a space may also lead to an inefficient use of heating, cooling and/or ventilation.

In accordance with the principles of the invention, a plurality of different sensors may be incorporated into a workspace management plan. The different sensors may be selected from a group consisting of ultra-sonic, infra-red, video, audio and thermal. In addition, pressure sensors may also be incorporated into the workspace. Pressure sensors may be incorporated into seats, for example, in order to determine when a person is sitting at the workspace. In addition to the conventional sensors 345, 355, such as occupancy sensors, more advanced sensor may be incorporated that provide a more granular spatial information regarding occupancy of the user(s) in a space. A sensor, such as a thermopile, a time of flight sensor, a camera may be incorporated into the workspace to provide a more accurate representation of the occupancy of the user(s) in a space.

Once a sensor is installed, and, thus, assigned to the workspace (or the subspace, as will be discussed) its field of view is adjusted to address multiple factors such as alignment with a targeted workstation, minimize the overlap with nearby sensors, avoid sensing from walkways, etc.

However, even with these advanced sensors, the dynamic alteration of the workspace disrupts the optimized conditions for which the space was designed.

One method, in accordance with the principles of the invention, is to identify alterations in the workspace and to compensate for such alterations in the workspace using granular motion data from the advanced sensors. The granular motion data may be used to determine changes in the position of furniture and/or persons. A second method is to dynamically select or reject parts of sensor measurements to improve the fidelity and fault detection capability of the system.

Figure 4A:
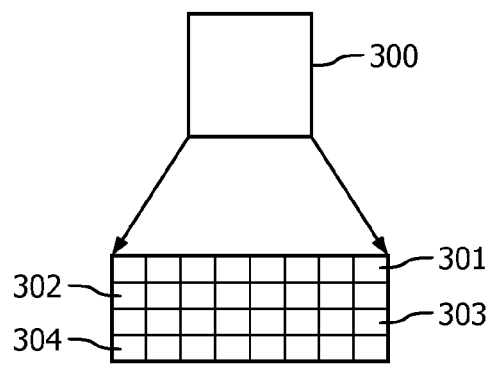

In a first aspect of the invention, an open office plan is discussed. In this exemplary embodiment of the invention, each space (e.g., 305, 315) may be represented as space 300, as shown in FIG. 4A. Space 300 is divided into a plurality of sub-spaces 301 . . . 304, wherein one or more of the sub-spaces is covered by at least one type of sensor (e.g., an occupancy sensor, a thermopile, etc.).

FIG. 4B illustrates an exemplary sensor output map associated with the space configuration shown in FIG. 3A. In this illustrative example, a finer granularity of the occupancy of the space 300 is shown, wherein a positive sensor output is represented as "1" in selected ones of the subspaces.

Assuming that the coordinates for the upper left corner are represented as (0,0), then the coordinates of the pixels that are detected will be given as (going from left to right, top to bottom): (4,1), (5,1), (6,1), (4,2), (5,2), (6,2), (4,3), (5,3).

A center of mass (i.e., cg) for these pixels can be computed as:

$$cg = \Sigma_{i=1}^{N} x_i$$

Where N is the number of sensing elements that see motion or indicate a detection; and x indicates the coordinates of the sensor.

Using this notion, the center of gravity for user A may be determined as:

$$cg=(4,1)+(5,1)+(6,1)+(4,2)+(5,2)+(6,2)+(4,3)+(5,3)$$

$$cg=(4.8750, 1.8750).$$

A similar analysis for the center of gravity of user B (see FIG. 4C) may be determined as $$cg=(2,1)+(3,1)+(4,1)+(2,2)+(3,2)+(4,2)+(2,3)+(3,3)$$

$$cg=(2.8750, 1.8750).$$

As it can be easily seen in this example, there is clearly a different pattern in the two cases. In accordance with the principles of the invention, a typical location of the occupant or a static piece of furniture may be determined initially. And may further be determined when the occupant is no longer present and/or the furniture has been displaced.

In one aspect of the invention, sensors, such as thermopile sensors, time-of-flight, camera, occupancy sensor, etc., may determine a mismatch between a current configuration and an initial configuration or a commissioned set up of a workspace.

In accordance with another aspect of the invention, once it may be determined that a center of gravity of the workspace has been moved then the field of view (FOV) of the sensors may be reoriented to accommodate the changed center of gravity.

The sensor reorientation may be performed by activating/deactivating some of the pixels in the sensor or by changing the orientation of the sensor.

With reference to FIG. 4D, a sensor map (or configuration) corresponding to the movement of element 325 of space 305 into the space 315 (as shown in FIG. 3B) illustrates that a fewer number of sensors detect the presence of the item 325 within space 305 as a portion of item 325 is included in space 315 (not shown). FIG. 4E illustrates a sensor map corresponding to the movement of item 325 into space 315. In this illustrated example the number of sensors showing positive indications is increased as a portion of item 325 is detected in space 315.

In this case, the center of gravity of each of space 305 and 315 is: (7.5, 2) and (2.3 and 1.9), respectively.

Thus, by determining a center of gravity of a space, a determination may be made whether a change in the configuration of a space has occurred and whether the change is significant to warranty a change in the field of view of the sensors.

In one aspect of the invention, it would be recognized that the center of gravity will be dynamic rather than static and will be moving during the day (e.g., persons entering and leaving the space). In one aspect of the invention, a time series analysis may be performed to understand changes in the location of the center of gravity associated with a space.

One example of such analysis will be to compute the time duration associated with each center of gravity computation.

In one aspect of the invention, when a maximum duration center of gravity is different from a reference center of gravity (e.g., the initial or commissioned setup) for multiple days, then facility managers may be alerted and/or the sensor FOV may be reoriented.

In one aspect of the invention, each of the spaces may be accumulated into a larger configuration (e.g., a floor plan) and into a further larger configuration (e.g., a building), that may be monitored by a plurality of sensors. In this case, a mapping of the sensors/spaces/floors/building may be constructed in a hierarchical manner to determine the effect of changes in one or more spaces on a floor and/or on the building.

In one aspect of the invention, a history of the configuration of a space, a floor, a building may be stored in data base that may be reviewed and evaluated when an indication of a change has been detected.

Figure 5:
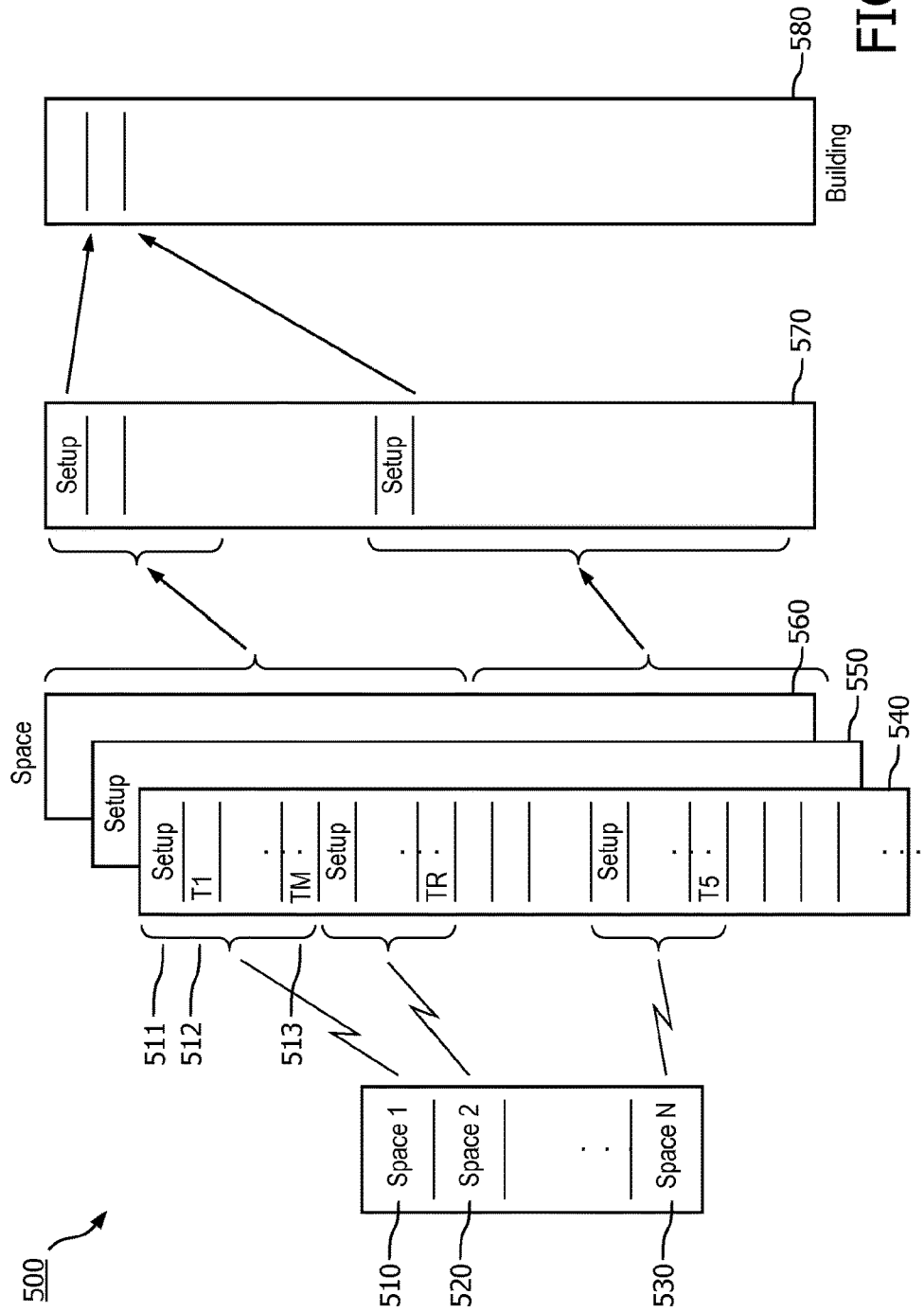
FIG. 5 illustrates an exemplary database in accordance with the principles of the invention.

FIG. 5 illustrates an exemplary data base configuration 500 in accordance with the principles of the invention. In this illustrated embodiment, each space 305, 315 is associated with a space 510, 520 . . . 530. An initial configuration (i.e., the commissioned setup) of each space 510, 520 . . . 530 may be represented by a center of gravity calculation based on sensor information obtained in the space. The center of gravity may be determined based on one of a plurality of conditions. For example, a center of gravity may be determined for static (or semi-static) items within the space (e.g., furniture) (element 540). Information regarding static (or semi-static) items may be determined by active sensors (e.g., ultrasound) or passive sensors (e.g., thermal).

In addition, a center of gravity of a dynamic nature (i.e., people entering or leaving the space or moving about the space) may be determined (element 550). In this case, occupancy sensors may be used to determine movement within the space.

In addition, a center of gravity may be determined based on a static and/or dynamic basis For example, if a user remains in the space without movement (e.g., sitting at a desk), the occupancy sensor fails to see movement but thermal sensors may detect an increase in a temperature associated with parts of the static information. In this case, the static/dynamic center of gravity (item 560) may be different than the static center of gravity of the furniture alone.

As is further illustrated, the center of gravity information (e.g., static, dynamic and static/dynamic) may be accumulated to provide a center of gravity for a higher level (e.g., a floor) (item 570). In this case, an accumulated center of gravity may be associated with each space within a floor. In this case, changes in the center of gravity of a number of spaces may affect the center of gravity of the floor or portions of the floor. For example, significant changes in the configuration of one or more spaces may create problems in ventilation, for example.

Furthermore, a center of gravity of each of the higher levels (i.e., floors) (item 570) may be further raised to an even higher level (e.g., a building) (item 580) to provide a center of gravity of the overall structure.

As is further illustrated, the center of gravity information for a space (space 1, 510, for example) is maintained as a function of change detection and a function of time. Thus, the configuration of space 1, 510 includes an initial configuration 511 and one or more further configurations 512, 513, etc., which represent different center of gravities at different times. In addition, in one aspect of the invention, a time duration that a space remains in a configuration may be determined and stored.

In one aspect, each change detected (as determined by, for example, a change in the sensor pattern or the center of gravity) is stored along with a time the change has occurred.

When a change in the center of gravity (for example) exceeds a threshold, then an alert may be generated that provides a manager with information of changes that have been detected.

Figure 6:
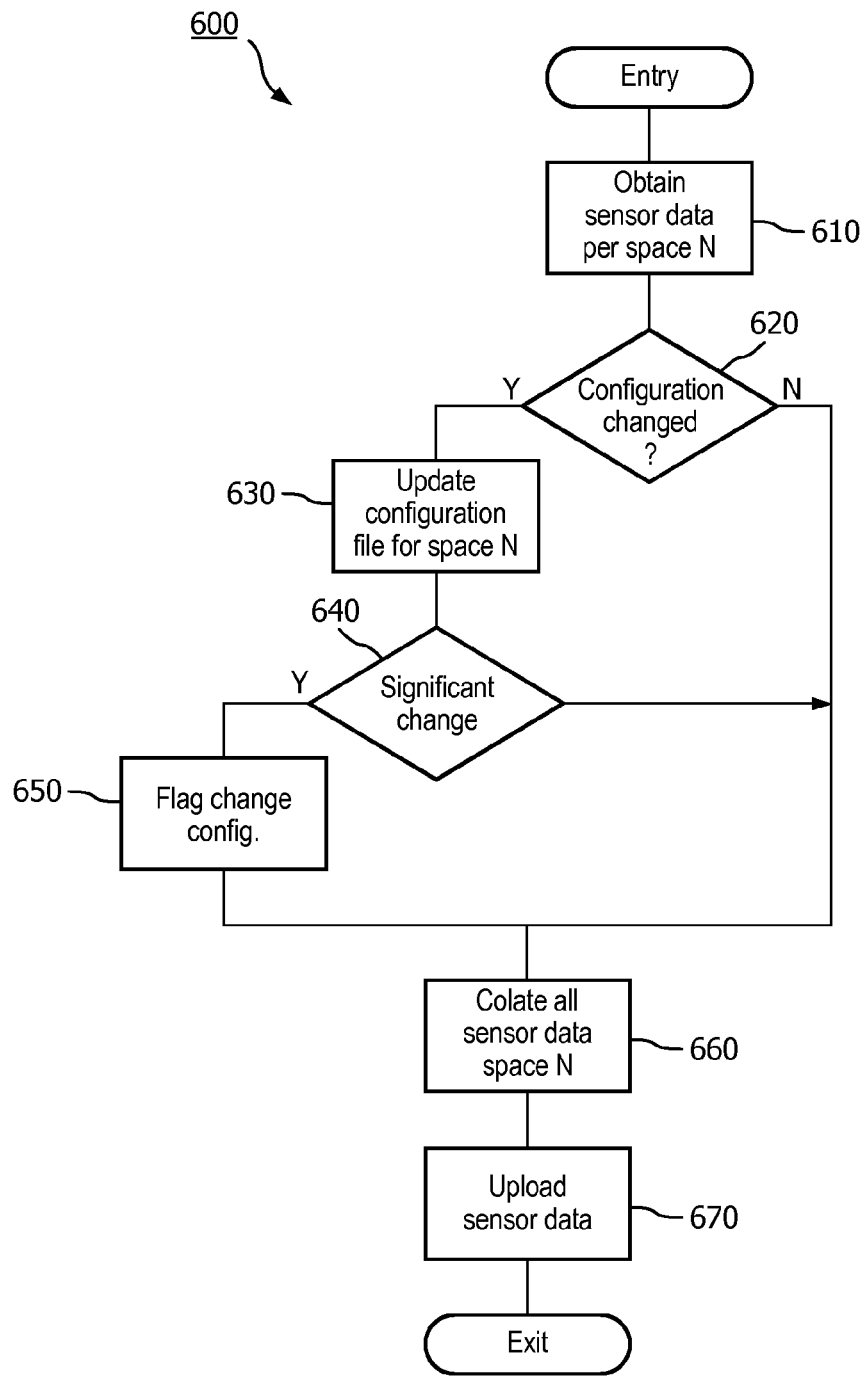
FIG. 6 illustrates an exemplary process for detecting changes in sensor mapping in accordance with the principles of the invention.

FIG. 6 illustrates a process 600 in accordance with the principles of the invention, where a change in a lower level (e.g., a space) may be detected and whether the detected change at the lower level is of such a magnitude so as to affect one or more higher levels.

In accordance with the principles of the invention, sensor data is collected in each of a plurality of spaces N at block 610. As previously described, the sensor data may represent at least one of audio, visual, thermal and/or occupancy information or other types of sensor data. In addition, the sensor data may be collected periodically, at a fixed rate, from the last sensor data collection or may be collected when a change in the space is detected (e.g., motion sensing).

At block 620, a configuration corresponding to a space associated with the received sensor data is determined based on the collected sensor data for the space N. A determination is made whether the currently determined configuration represents a change with regard to a previous configuration. In one example, a center of gravity of the current configuration may be compared to the latest center of gravity configuration, as stored in the data base (element 540).

If a change is detected, then the data base for the corresponding space N is updated so that the current configuration is retained as the latest configuration, at block 630.

At block 640, a determination is made whether the change is considered a significant change. For example, a change may be considered significant when a change in the center of gravity (or the sensor detection pattern) exceeds a threshold value. (e.g., a change of +/−10%).

If a significant change is determined, then an alert flag is activated to indicate a significant change has been determined at block 650.

At block 660, the received sensor data is correlated with other sensor data associated with space N. In addition, the sensor data of space N may be correlated with adjacent spaces (e.g., space N−1, space N+1) to form a larger pattern of the workspaces or create a mapping of workspaces associated with a floor, for example.

At block 670, the sensor data and alert flag is uploaded into the data base.

In addition, the alert flag and associated change in space N may be provided to a building manager.

In addition, the alert flag may be used to automatically generate a new configuration mapping to alter the FOV of one or more sensors within the corresponding space.

Figure 7:
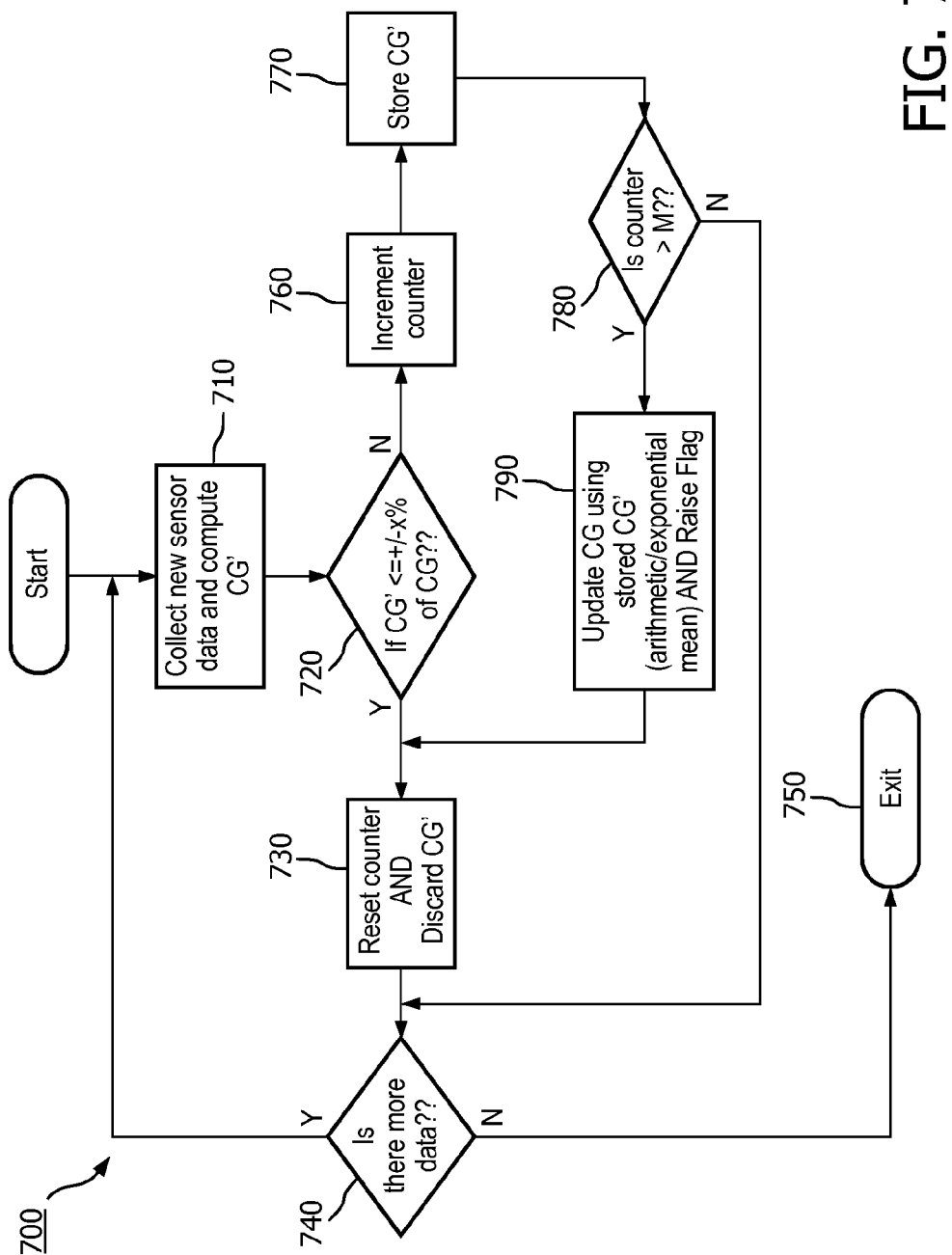
FIG. 7 illustrates a second exemplary process for detecting changes in sensor mapping in accordance with the principles of the invention.

FIG. 7 illustrates a second exemplary process 700 in accordance with the principles of the invention. In this aspect of the invention, at block 710 data may be collected from the sensors as previously described with regard to block 610 (FIG. 6) and a current center of gravity (CG') of the currently collected sensor data may be calculated. At block 720 a determination is made whether the current center of gravity (CG') is within (i.e., less than or equal) to a tolerance about the previous center of gravity (CG).

If the current center of gravity is within the tolerance, a counter is reset and the current center of gravity calculation (CG') is discarded at block 730.

At block 740, a determination is made whether more data is to be processed. If the answer is negative, then processing continues to block 750 to exit the processing.

However, if the answer is in the affirmative, the processing returns to block 710 in order to collect a next sample of sensor data.

Returning to block 720, if the current center of gravity (CG') is greater than a tolerance about (e.g., +/−10%) the previous center of gravity (CG), processing continues to block 760, wherein a counter is incremented and the current center of gravity (CG') is stored at block 770.

At block 780, a determination is made whether the counter is greater than a predetermined value (e.g., M). If the counter is not greater that than the predetermined value (M) then processing continues at block 740.

Otherwise, processing continues to block 790, wherein the current center of gravity (CG'), which had been stored, is stored as the previous center of gravity (CG).

In addition an alert flag may be raised to indicate that the configuration of the workspace, as determined by the center of gravity, has changed significantly.

Processing continues at block 730, wherein the counter is reset and the current center of gravity (CG') is reset.

In one aspect of the invention, sensor data may be collected periodically or aperiodically over a known time period in order to determine a plurality of current center of gravities (i.e., $CG'_i$). Each of the individual $CG'_i$ are compared to the tolerance value. When at least M individual $CG'_i$ have been determined to be greater than a tolerance about the previous center of gravity (CG), then a new center of gravity is stored. In one aspect of the invention, the new center of gravity may be an average of the individual $CG'_i$ collected during the known time period. In another aspect of the invention, the new center of gravity may be determined as a weighted average of the individual $CG'_i$ collected during the known time period. A weighted average may consider the values of the collected data over time. In one exemplary case, the weighting of older values of $CG'_i$ may be less than the weighting of newer values of $CG'_i$.

In one aspect of the invention, sensor data collection may be performed on a periodic basis over periods such as hours, days, weeks, etc. The period at which sensor data is collected within the periodic time period may be respectively, minutes, hours, days. For example, the system may collect sensor data on an hourly for a known period of a day. Each of the twenty-four $CG'_i$ collected (i.e., hourly collection) during the known period (i.e., day) may be compared to a tolerance value associated with a previous CG to determine whether a significant change in the configuration has occurred. As discussed above, if a number of M $CG'_i$ values exceed a threshold (or tolerance) value then a significant change is indicated.

In another aspect of the invention, sensor data collection may initially be performed on a periodic basis and then altered when a first change in $CG'_i$ is determined. In this case, an hourly collection of sensor data may be altered to a tens of minutes data collection rate in order to provide a faster determination of a change in configuration. Correspondingly the known period of time in which the data is collected may also be altered.

While FIG. 7 illustrates a system in which M consecutive $CG'_i$ values are required to determine a significant change has occurred, in an alternative aspect of the invention, sensor data collections may be performed and a determination whether a number of $CG'_i$ indicated to exceed the tolerance may is above a threshold value (e.g., M/number of collections). For example, if 24 data collections have been performed and at least 18, for example, indicate that the tolerance value has been exceeded, then a significant change is indicated and a new center of gravity is performed. As would be appreciated the threshold value may be determined as a function of the total number of samples collected in the known period. In one aspect of the invention, the threshold may be set at 75 percent. However, it would be appreciated that the threshold may in increased or decreased without altering the scope of the invention.

Figure 8:
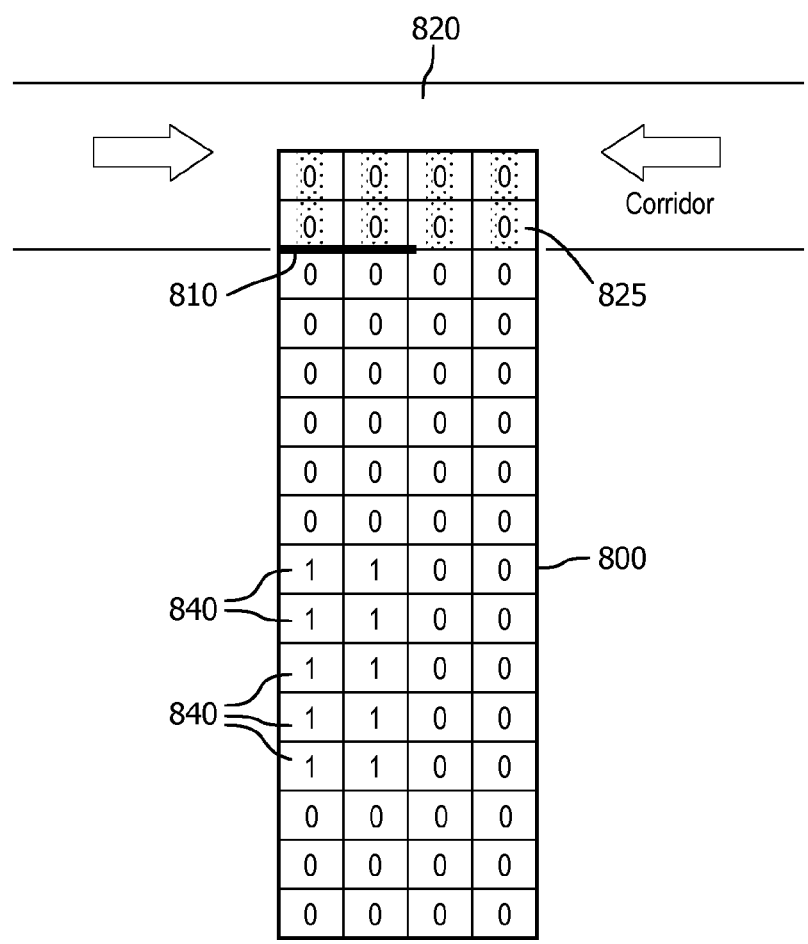
FIG. 8 illustrates another aspect of the processing in accordance with the principles of the invention.

FIG. 8 illustrates another aspect of the invention, wherein sections of a space may be blocked off so that changes in the subspaces associated with the space may be discarded.

As shown, part of the sensor's coverage region can be masked so that even if the sensor detects motion, for example, the detected motion does not trigger the lighting system.

In case of private office 800, for example, there is often a sensor placed near the door so that lights are switched on as soon as a user enters the office. The occupancy sensors often have a rotating shield that is used to limit the coverage of the sensor in a particular direction. Therefore, with the occupancy sensor near the entrance 810, it is shielded so that the sensor is not triggered by people passing in the corridor 820.

In this illustrative example, sensor(s) may be placed so that the subspaces within the rows 825 are associated with corridor 820, while other sensor(s) (not shown) may be associated with the remaining subspaces in space 800.

Furthermore, the subspaces 840, marked by 1's represent the user's desk, and, thus, represents an initial configuration of the space 800. As previously discussed, the initial configuration may be determined based on static or dynamic sensor measurements.

The dark black line 810 indicates the entrance to the office. The rows 825 within corridor 820 are masked and do not contribute to the determination of the configuration of space 800. Thus, the lighting system of space 800 may be controlled by determining the configuration of space 800 without considering changes that may occur in the row (subspaces) of space 825. However, it would be appreciated that the sensor data associated with space 825 may be collected to determine movement within the corridor 820 and adjusting lighting conditions based on the detected motion within these sub-spaces.

The invention has been described with reference to specific embodiments. One of ordinary skill in the art, however, appreciates that various modifications and changes can be made without departing from the scope of the invention as set forth in the claims. Accordingly, the specification is to be regarded in an illustrative manner, rather than with a restrictive view, and all such modifications are intended to be included within the scope of the invention.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

Furthermore, a computer, a processor and/or dedicated hardware/software are described herein as being capable of performing the processing described herein, and it would be recognized that a computer, a processor and/or dedicated hardware/software are well-known elements in the art of signal processing and, thus, a detailed description of the elements of the processor need not be provided in order for one skilled in the art to practice the invention described, herein.

Benefits, other advantages, and solutions to problems have been described above with regard to specific embodiments. The benefits, advantages, and solutions to problems, and any element(s) that may cause any benefits, advantages, or solutions to occur or become more pronounced, are not to be construed as a critical, required, or an essential feature or element of any or all of the claims.

As used herein, the terms "comprises", "comprising", "includes", "including", "has", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "of" refers to an inclusive "or" and not to an exclusive "or". For example, a condition A or B is satisfied by any one of the following: A is true (or present) and B is false (or not present); A is false (or not present) and B is true (or present); and both A and B are true (or present).

The terms "a" or "an" as used herein are to describe elements and components of the invention. This is done for convenience to the reader and to provide a general sense of the invention. The use of these terms in the description herein should be read and understood to include one or at least one. In addition, the singular also includes the plural unless indicated to the contrary. For example, reference to a composition containing "a compound" includes one or more compounds. As used in this specification and the appended claims, the term "or" is generally employed in its sense including "and/or" unless the content clearly dictates otherwise.

All numeric values are herein assumed to be modified by the term "about," whether or not explicitly indicated. The term "about" generally refers to a range of numbers that one of skill in the art would consider equivalent to the recited value (i.e., having the same function or result). In any instances, the terms "about" may include numbers that are rounded (or lowered) to the nearest significant figure.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A system for managing sensors in a space configuration, comprising:

a plurality of sensors incorporated into a space, at least one of the plurality of sensors providing a plurality of sensor pixel information of the space;

a processor:

receiving a plurality of sensor pixel information from respective selected ones of the plurality of sensors, associating one or more of the sensor pixel information with a corresponding subspace of a plurality of subspaces of the space;

establishing a current configuration of the space associated with the corresponding subspaces, by mapping the received sensor pixel information associated with the corresponding subspace from the selected ones of plurality of sensors;

determining a center of gravity of motion within the space, using the plurality of sensor pixel information of the plurality of subspaces over a predetermined period of time, of the current configuration;

comparing the center of gravity of motion of the current configuration of the space with a center of gravity of motion within the space of a previous configuration of the space over a previous predetermined period of time;

determining whether a configuration change from the previous configuration of the space has occurred; and adjusting a field of view of at least one of the selected ones of the plurality of sensors based on the configuration change.

2. The system of claim 1, comprising:

a storage unit storing the current configuration with at least one of the previous configurations.

3. The system of claim 2, wherein one of the at least one of the previous configurations is associated with an initial configuration.

4. The system of claim 1, wherein the plurality of sensors are selected from a group consisting of: audio, video, sonic, ultra-sonic, infra-red, thermal, thermopile, a time of flight sensor, and a camera.

5. The system of claim 1, wherein the adjusting a field of view of at least one of the selected ones of the plurality of sensors includes by activating/deactivating one or more pixels in the selected ones of the plurality of sensors or changing the orientation of one or more of the selected ones of the plurality of sensors.

6. The system of claim 2, comprising:

storing, in the storage unit, the current configuration when a change in the previous configuration is determined.

7. The system of claim 1 comprising:

the processor:

integrating each of the plurality of spaces into multiple space plan.

8. The system of claim 7, comprising:

storing a time associated with the stored current configuration.

9. A management system for managing sensors in configurations arranged in a plurality of spaces; comprising:

a plurality of sensors assigned to each of the plurality of spaces, at least one of the plurality of sensors providing a plurality of sensor pixel information of a respective space, wherein each of the spaces is divided into a plurality of subspaces;

a processing system:

receiving a plurality of sensor pixel information from respective selected ones of the plurality of sensors;

collating the one or more sensor pixel information received from selected ones of the plurality of sensors with a corresponding subspace of the plurality of spaces;

determining a current configuration of the corresponding ones of the plurality of spaces based on the collated received signals by mapping the received sensor pixel information associated with the corresponding subspace from the selected ones of plurality of sensors;

determining a center of gravity of motion within the space, using the plurality of sensor pixel information of the plurality of subspaces over a predetermined period of time, of the current configuration;

determining whether the current configuration is different than a previous configuration of the corresponding ones of the plurality of spaces; and adjusting a field of view of at least one of the selected ones of the plurality of sensors based on the configuration change.

10. The management system of claim 9, wherein the plurality of sensors are selected from a group consisting of: audio, visual, ultra-sonic, infra-red, thermal, thermopile, a time of flight sensor, a camera.

11. The management system of claim 9, a storage unit storing the current configuration with at least one of the previous configurations.

12. The management system of claim 9, wherein the adjusting a field of view of at least one of the selected ones of the plurality of sensors includes by activating/deactivating one or more pixels in the selected ones of the plurality of sensors or changing the orientation of one or more of the selected ones of the plurality of sensors.

13. The system of claim 9, wherein comparing the current configuration with the previous configuration comprises:

the processor:

determining a change in associated subspace elements of the current configuration and the previous configuration.

* * * * *